United States Patent
Kagawa et al.

(10) Patent No.: US 10,121,646 B2
(45) Date of Patent: Nov. 6, 2018

(54) SUBSTRATE PROCESSING APPARATUS AND SUBSTRATE PROCESSING METHOD

(71) Applicant: Tokyo Electron Limited, Tokyo (JP)

(72) Inventors: Koji Kagawa, Koshi (JP); Hisashi Kawano, Koshi (JP); Meitoku Aibara, Koshi (JP); Yuki Yoshida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 15/825,779

(22) Filed: Nov. 29, 2017

(65) Prior Publication Data

US 2018/0082831 A1    Mar. 22, 2018

Related U.S. Application Data

(62) Division of application No. 15/226,396, filed on Aug. 2, 2016, now Pat. No. 9,870,914.

(30) Foreign Application Priority Data

Aug. 7, 2015  (JP) ................................. 2015-157731

(51) Int. Cl.
  *H01L 21/02* (2006.01)
  *H01L 21/67* (2006.01)

(52) U.S. Cl.
  CPC ...... *H01L 21/0206* (2013.01); *H01L 21/6719* (2013.01); *H01L 21/67028* (2013.01); *H01L 21/67034* (2013.01); *H01L 21/67051* (2013.01); *H01L 21/67109* (2013.01); *H01L 21/67248* (2013.01); *H05K 999/99* (2013.01)

(58) Field of Classification Search
  CPC .......... H01L 21/67248; H01L 21/6719; H01L 21/67109; H01L 21/0206; H01L 21/67028; H01L 21/67034; H01L 21/67051
  See application file for complete search history.

(56) References Cited

U.S. PATENT DOCUMENTS 8,632,146 B2    1/2014  Yoshida
9,620,353 B2    4/2017  Igarashi et al.
(Continued)

FOREIGN PATENT DOCUMENTS

| JP | 2012-243869 A1 | 12/2012 |
| JP | 2013-110418 A1 | 6/2013 |
| JP | 2015-106645 A1 | 6/2015 |

OTHER PUBLICATIONS

Japanese Office Action (Application No. 2015-157731) dated Jul. 13, 2018 (with English translation).

*Primary Examiner* — Savitr Mulpuri
(74) *Attorney, Agent, or Firm* — Burr & Brown, PLLC

(57) ABSTRACT

In order to remove from a substrate having a concavo-convex pattern formed on a surface of the substrate, a solid material with which a concave portion of the concavo-convex pattern is filled and which is formed by evaporating a solvent in a sublimable substance solution containing a sublimable substance that sublimates at a temperature equal to or higher than a first temperature, and an impurity that evaporates at a temperature equal to or higher than a second temperature that is higher than the first temperature, the prevent invention provides a substrate processing apparatus and a substrate processing method which heat the substrate to a temperature equal to or higher than the second temperature.

7 Claims, 4 Drawing Sheets

(56) References Cited

U.S. PATENT DOCUMENTS

| | | | |
|---|---|---|---|
| 2008/0223825 A1* | 9/2008 | Onishi | H01L 21/02057 216/58 |
| 2012/0267340 A1* | 10/2012 | Kakimoto | C23C 16/045 216/37 |
| 2013/0008868 A1* | 1/2013 | Uozumi | G03F 7/162 216/41 |
| 2015/0128994 A1 | 5/2015 | Kaneko et al. | |
| 2015/0155159 A1 | 6/2015 | Igarashi et al. | |
| 2015/0273535 A1 | 10/2015 | Sato et al. | |
| 2016/0035564 A1 | 2/2016 | Aibara et al. | |

* cited by examiner

SUBSTRATE PROCESSING APPARATUS AND SUBSTRATE PROCESSING METHOD

CROSS REFERENCE TO RELATED APPLICATIONS

This application is a division of U.S. application Ser. No. 15/226,396, filed Aug. 2, 2016, and claims the benefit of priority from Japanese Patent Application No. 2015-157731, filed Aug. 7, 2015, the entire contents of which are incorporated herein by reference.

FIELD OF THE INVENTION

The present invention relates to a substrate processing apparatus and a substrate processing method, which remove from a substrate having a concavo-convex pattern formed on a surface of the substrate, a solid material with which a concave portion of the concavo-convex pattern is filled.

BACKGROUND OF THE INVENTION

Recently, there is suggested a method in which a substrate such as a semiconductor wafer is subjected to liquid processing, and then the substrate after being processed with the liquid is dried by using a sublimable substance, and an example thereof is disclosed in JP 2012-243869 A.

In the method disclosed in JP 2012-243869 A, when drying the substrate by removing a liquid on the substrate having a concavo-convex pattern formed on a surface of the substrate, first, a sublimable substance solution is supplied to the substrate to fill a concave portion of the concavo-convex pattern of the substrate with the sublimable substance solution. Then, a solvent in the sublimable substance solution is dried to fill the concave portion of the concavo-convex pattern of the substrate with the sublimable substance in a solid state. Subsequently, the substrate is heated at a temperature higher than a sublimation temperature of the sublimable substance to remove the sublimable substance from the substrate. According to the method disclosed in JP 2012-243869 A, since the concave portion of the concavo-convex pattern of the substrate is filled with the sublimable substance in a solid state, and then the sublimable substance is sublimated to be removed from the inside of the concave portion, a stress caused by a surface tension of a liquid that exists on the substrate does not operate to the convex portion of the concavo-convex pattern of the substrate. Accordingly, it is possible to prevent falling-down of the convex portion, that is, collapse of the concavo-convex pattern.

Paragraph [0030] of JP 2012-243869 A discloses that when heating the substrate at a temperature higher than the sublimation temperature of the sublimable substance to remove the sublimable substance from the substrate, the substrate is heated at a temperature of 100° C. to 300° C.

SUMMARY OF THE INVENTION

However, the sublimable substance solution contains an impurity, for example, a substance that is mixed-in to the sublimable substance during manufacturing of the sublimable substance, a substance that is mixed-in to the solvent during manufacturing of the solvent, and the like, in addition to the sublimable substance and the solvent. Therefore, the solid material obtained by evaporating the solvent in the sublimable substance solution contains an impurity in addition to the sublimable substance in a solid state. The present applicant has specified that the impurity include a substance which remains on the substrate without being evaporated even when the substrate is heated at a temperature of 100° C. to 300° C., for example, an organic impurity, a polymer having a fluorine atom, and the like.

Here, an object of the invention is to provide a substrate processing apparatus and a substrate processing method which are capable of removing from a substrate having a concavo-convex pattern formed on a surface of the substrate, not only a sublimable substance but also an impurity, which are contained in a solid material with which a concave portion of the concavo-convex pattern is filled.

In addition, an object of the invention is to provide a non-transitory computer-readable recording medium storing a program, wherein upon execution of the program by a computer that controls an operation of a substrate processing apparatus, the computer controls the substrate processing apparatus so that the substrate processing method according to the present invention is performed.

To solve the above-described problem, the invention provides a substrate processing apparatus and a substrate processing method as described below.

(1) A substrate processing apparatus, comprising:
a processing unit configured to remove from a substrate having a concavo-convex pattern formed on a surface of the substrate, a solid material with which a concave portion of the concavo-convex pattern is filled; and
a control unit configured to control an operation of the processing unit,
wherein the processing unit comprises a processing chamber in which the substrate is disposed, and a substrate heating unit configured to heat the substrate disposed in the processing chamber,
the solid material is formed by evaporating a solvent in a sublimable substance solution supplied to the concave portion, the sublimable substance solution containing a sublimable substance that sublimates at a temperature equal to or higher than a first temperature, and an impurity that evaporates at a temperature equal to or higher than a second temperature that is higher than the first temperature, and
the control unit controls the substrate heating unit so that the substrate disposed in the processing chamber is heated to a temperature equal to or higher than the second temperature.

(2) The substrate processing apparatus according to (1), wherein the processing unit further comprises an exhaust unit configured to discharge an atmosphere inside the processing chamber, and
the control unit controls the substrate heating unit and the exhaust unit so that the substrate disposed in the processing chamber is heated to a temperature equal to or higher than the second temperature while discharging the atmosphere inside the processing chamber.

(3) The substrate processing apparatus according to (2), wherein the control unit controls the substrate heating unit and the exhaust unit so that the substrate disposed in the processing chamber is heated at a temperature that is equal to or higher than the first temperature and lower than the second temperature and is subsequently heated at a temperature equal to or higher than the second temperature while discharging the atmosphere inside the processing chamber.

(4) The substrate processing apparatus according to (3), wherein the control unit controls the substrate heating unit and the exhaust unit so that an exhaust volume per unit time discharged from the processing chamber when the substrate disposed in the processing chamber is heated at a temperature equal to or higher than the second temperature exceeds an exhaust volume per unit time discharged from the processing chamber when the substrate disposed in the processing chamber is heated at a temperature that is equal to or higher than the first temperature and lower than the second temperature.

(5) The substrate processing apparatus according to (2), wherein the control unit controls the substrate heating unit and the exhaust unit so that the substrate disposed in the processing chamber is heated at a temperature equal to or higher than the second temperature while discharging the atmosphere inside the processing chamber.

(6) The substrate processing apparatus according to any one of (2) to (5), wherein the control unit controls the substrate heating unit and the exhaust unit so that a temperature of the substrate disposed in the processing chamber is maintained at a temperature equal to or higher than the second temperature for predetermined time while discharging the atmosphere inside the processing chamber.

(7) The substrate processing apparatus according to any one of (2) to (6), wherein the processing unit further comprises a wall-surface heating unit configured to heat a wall surface of the processing chamber, and the control unit controls the substrate heating unit, the exhaust unit and the wall-surface heating unit so that the wall surface of the processing chamber is heated to a temperature equal to or higher than the second temperature when the substrate disposed in the processing chamber is heated while discharging the atmosphere inside the processing chamber.

(8) The substrate processing apparatus according to any one of (1) to (7), the apparatus further comprising a supplying unit configured to supply the sublimable substance solution to the concave portion, wherein the solid material is formed by evaporating the solvent in the sublimable substance solution supplied to the concave portion by the supplying unit.

(9) A substrate processing method for removing from a substrate having a concavo-convex pattern formed on a surface of the substrate, a solid material with which a concave portion of the concavo-convex pattern is filled, the method comprising a heating step of heating the substrate disposed in a processing chamber, wherein the solid material is formed by evaporating a solvent in a sublimable substance solution supplied to the concave portion, the sublimable substance solution containing a sublimable substance that sublimates at a temperature equal to or higher than a first temperature, and an impurity that evaporates at a temperature equal to or higher than a second temperature that is higher than the first temperature, and in the heating step, the substrate disposed in the processing chamber is heated to a temperature that is equal to or higher than the second temperature.

(10) The substrate processing method according to (9), wherein in the heating step, the substrate disposed in the processing chamber is heated to a temperature that is equal to or higher than the second temperature while discharging an atmosphere inside the processing chamber.

(11) The substrate processing method according to (10), wherein in the heating step, the substrate disposed in the processing chamber is heated at a temperature that is equal to or higher than the first temperature and lower than the second temperature and is subsequently heated at a temperature equal to or higher than the second temperature while discharging the atmosphere inside the processing chamber.

(12) The substrate processing method according to (11), wherein in the heating step, an exhaust volume per unit time discharged from the processing chamber when the substrate disposed in the processing chamber is heated at a temperature equal to or higher than the second temperature exceeds an exhaust volume per unit time discharged from the processing chamber when the substrate disposed in the processing chamber is heated at a temperature that is equal to or higher than the first temperature and lower than the second temperature.

(13) The substrate processing method according to (10), wherein in the heating step, the substrate disposed in the processing chamber is heated at a temperature equal to or higher than the second temperature while discharging the atmosphere inside the processing chamber.

(14) The substrate processing method according to any one of (10) to (13), wherein in the heating step, a temperature of the substrate disposed in the processing chamber is maintained at a temperature equal to or higher than the second temperature for predetermined time while discharging the atmosphere inside the processing chamber.

(15) The substrate processing method according to any one of (10) to (14), wherein in the heating step, a wall surface of the processing chamber is heated to a temperature equal to or higher than the second temperature when the substrate disposed in the processing chamber is heated while discharging the atmosphere inside the processing chamber.

(16) The substrate processing method according to any one of (9) to (15), the method further comprising a supplying step of supplying the sublimable substance solution to the concave portion, wherein the solid material is formed by evaporating the solvent in the sublimable substance solution supplied to the concave portion in the supplying step.

(17) A non-transitory computer-readable recording medium storing a program, wherein upon execution of the program by a computer that controls an operation of a substrate processing apparatus, the computer controls the substrate processing apparatus so that the substrate processing method according to any one of (9) to (16) is performed.

According to the substrate processing apparatus and the substrate processing method of the invention, it is possible to remove from a substrate having a concavo-convex pattern formed on a surface of the substrate, not only a sublimable substance but also an impurity, which are contained in a solid material with which a concave portion of the concavo-convex pattern is filled.

DETAILED DESCRIPTION OF THE INVENTION

Hereinafter, embodiments of the invention will be described with reference to the accompanying drawings.

A substrate processing apparatus 1 according to an embodiment of the invention is an apparatus configured to perform a substrate drying method for drying a substrate after being subjected to liquid processing by using sublimation of a sublimable substance.

The substrate drying method which is performed by the substrate processing apparatus 1 includes liquid processing (a chemical liquid cleaning step, a rinsing step, a solvent substitution step, a sublimable substance solution filling step, and a solid material precipitation step) with respect to a substrate, and solid material removal processing with respect to the substrate after being subjected to the liquid processing. That is, the substrate processing apparatus 1 performs the solid material removal processing as one process in the substrate drying method.

Figure 4A:
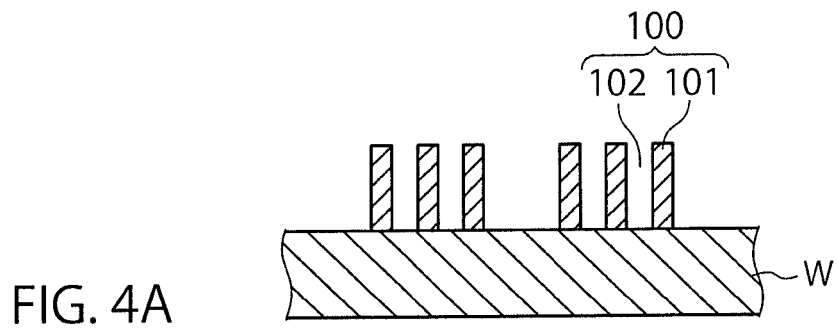
FIGS. 4A to 4D are schematic diagrams illustrating steps of a substrate processing method which is performed by the substrate processing apparatus illustrated in FIG. 1.

As illustrated in FIG. 4A, the substrate for which the substrate drying method is performed by the substrate processing apparatus 1 is a substrate W in which a concavo-convex pattern 100 including a convex portion 101 and a concave portion 102 is formed on a surface thereof. For example, the substrate W is a semiconductor wafer. As described below, in the liquid processing with respect to the substrate W, the concave portion 102 of the concavo-convex pattern 100 of the substrate W is filled with a solid material SS, and thus a solid material filled substrate (refer to FIG. 4C), which includes the substrate W and the solid material SS with which the concave portion 102 of the concavo-convex pattern 100 of the substrate W is filled, is formed. In addition, the solid material SS with which the concave portion 102 of the concavo-convex pattern 100 of the substrate W is filled is removed from the substrate W in the solid material removal processing with respect to the substrate after being subjected to the liquid processing (that is, the solid material filled substrate).

Figure 1:
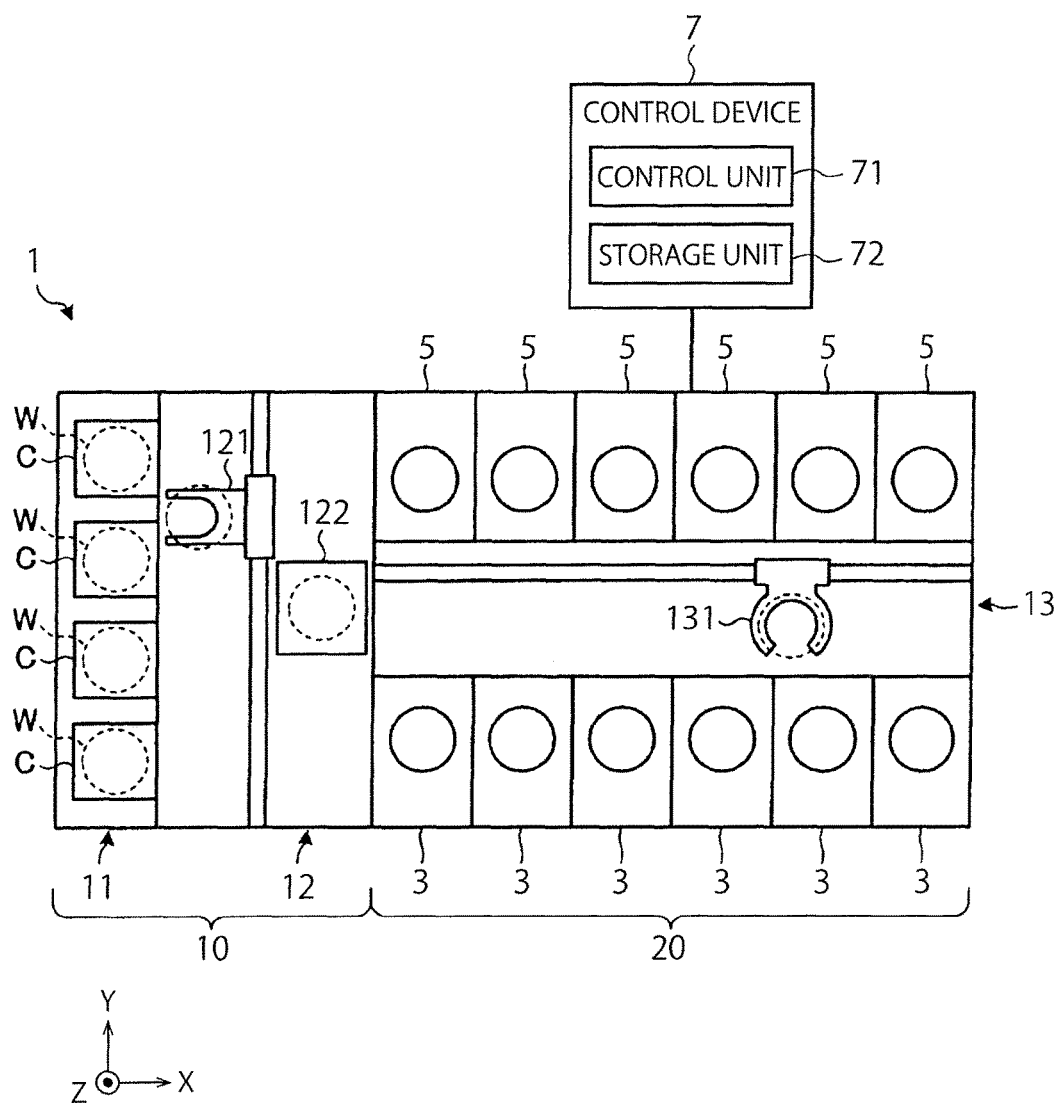
FIG. 1 is a schematic diagram illustrating a structure of a substrate processing apparatus according to an embodiment of the invention.

As illustrated in FIG. 1, the substrate processing apparatus 1 includes a liquid processing unit 3 configured to perform liquid processing, a solid material removal processing unit 5 configured to perform solid material removal processing, and a control device 7 configured to control operations of the liquid processing unit 3 and the solid material removal processing unit 5.

As illustrated in FIG. 1, the substrate processing apparatus 1 includes a carry-in/out station 10 and a processing station 20. The carry-in/out station 10 and the processing station 20 are provided adjacent to each other. In FIG. 1, in order to clarify positional relationships, the X-axis, Y-axis, and Z-axis which are orthogonal to each other are defined, and the positive Z-axis direction is defined as a vertically upward direction.

The carry-in/out station 2 is provided with a carrier placing section 11 and a transfer section 12. In the carrier placing section 11, a plurality of transfer vessels (hereinafter, referred to as "carriers C") are placed to accommodate a plurality of substrates W horizontally.

The transfer section 12 is provided adjacent to the carrier placing section 11. Inside the transfer section 12, a substrate transfer device 121 and a delivery unit 122 are provided.

The substrate transfer device 121 is provided with a substrate holding mechanism configured to hold the substrate W. Further, the substrate transfer device 121 is movable horizontally and vertically and pivotable around a vertical axis, and transfers the substrate W between the carrier C and the delivery unit 122 by using the substrate holding mechanism.

The processing station 20 is provided adjacent to the transfer section 12. The processing station 20 is provided with a transfer section 13, the liquid processing units 3 and the solid material removal processing units 5. The liquid processing units 3 and the solid material removal processing units 5 are arranged at both sides of the transfer section 13.

Inside of the transfer section 13, a substrate transfer device 131 is provided. The substrate transfer device 131 is provided with a substrate holding mechanism configured to hold the substrate W. Further, the substrate transfer device 131 is movable horizontally and vertically and pivotable around a vertical axis, and transfers the substrate W between the delivery unit 122 and the liquid processing unit 3, between the liquid processing unit 3 and the solid material removal processing unit 5, and between the solid material removal processing unit 5 and the delivery unit 122, by using the substrate holding mechanism.

In the substrate processing apparatus 1, the substrate transfer device 121 of the carry-in/out station 10 first takes out a substrate W from the carrier C, and then places the taken substrate W on the delivery unit 122. The substrate W placed on the delivery unit 122 is taken out from the delivery unit 122 by the substrate transfer device 131 of the processing station 20 and carried into the liquid processing unit 3, and then subjected to liquid processing performed by the liquid processing unit 3. The substrate W after being subjected to the liquid processing is carried out from the liquid processing unit 3 by the substrate transfer device 131 and carried into the solid material removal processing unit 5, and then subjected to solid material removal processing performed by the solid material removal processing unit 5. The substrate W after being subjected to the solid material removal processing is carried out from the solid material removal processing unit 5 by the substrate transfer device 131 and placed on the delivery unit 122, and then returned to the carrier C by the substrate transfer device 121.

Figure 2:
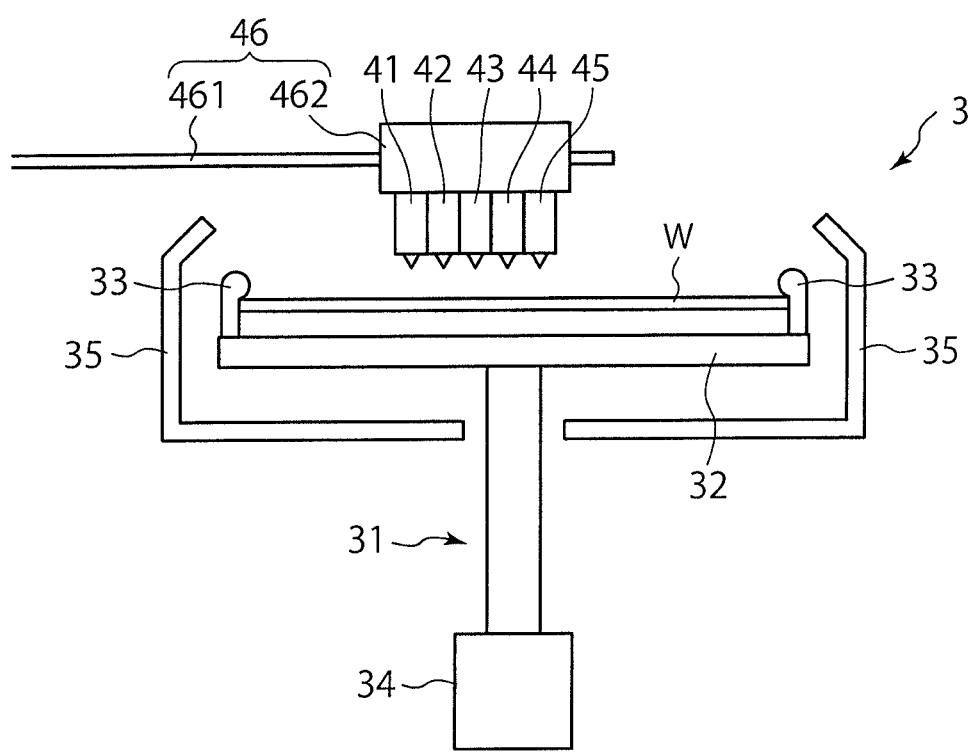
FIG. 2 is a schematic diagram illustrating a structure of a liquid processing unit that is provided to the substrate processing apparatus illustrated in FIG. 1.

As illustrated in FIG. 2, the liquid processing unit 3 includes a spin chuck 31 configured to rotate while holding the substrate W in an approximately horizontal manner. The spin chuck 31 includes a substrate supporting unit 32 configured to hold the substrate W in a horizontal posture by a plurality of holding members 33 which hold the peripheral portion of the substrate W, and a rotation drive unit 34 configured to rotate the substrate supporting unit 32 around a vertical axial line. A cup 35, which collects various kinds of processing liquids such as a chemical liquid, a rinse liquid, and a sublimable substance solution which are scattered from the substrate W, is provided at the periphery of the substrate supporting unit 32. The substrate supporting unit 32 of the spin chuck 31 is a so-called mechanical chuck type that grips a peripheral edge of the substrate W by the movable holding members 33, but there is no limitation thereto. The substrate supporting unit 32 may be a so-called vacuum chuck type that vacuum-suctions the central portion of a rear surface of the substrate W.

As illustrated in FIG. 2, the liquid processing unit 3 includes a chemical liquid nozzle 41 that supplies a chemical liquid (CHM) to the substrate W, a rinse liquid nozzle 42 that supplies a rinse liquid such as pure water (DIW) to the substrate W, a solvent nozzle 43 that supplies a solvent such as isopropyl alcohol (IPA) to the substrate W, a dry gas nozzle 44 that supplies a dry gas such as a nitrogen gas and dry air to the substrate W, and a sublimable substance solution nozzle 45 that supplies a sublimable substance solution to the substrate W.

Processing fluids (a chemical liquid, a rinse liquid, a solvent, a dry gas, and a sublimable substance solution) are respectively supplied to the nozzles 41 to 45 from a chemical liquid supply source, a rinse liquid supply source, a solvent supply source, a dry gas supply source, and a sublimable substance solution supply source, through a processing fluid line in which an appropriate flow rate adjustor, for example, a flow rate adjusting valve and an on-off valve are interposed. Thus, the liquid processing unit 3 includes a chemical liquid supply unit including the nozzle 41 and the chemical liquid supply source that supplies a chemical liquid to the nozzle 41, a rinse liquid supply unit including the nozzle 42 and the rinse liquid supply source that supplies a rinse liquid to the nozzle 42, a solvent supply unit including the nozzle 43 and the solvent supply source that supplies a solvent to the nozzle 43, a dry gas supply unit including the nozzle 44 and the dry gas supply source that supplies a dry gas to the nozzle 44, and a sublimable substance solution supply unit including the nozzle 45 and the sublimable substance solution supply source that supplies a sublimable substance solution to the nozzle 45.

As illustrated in FIG. 2, the liquid processing unit 3 includes a nozzle moving mechanism 46 that drives the nozzles 41 to 45. The nozzle moving mechanism 46 includes a guide rail 461 and a drive mechanism-embedded movable body 462 that can move along the guide rail 461. The nozzles 41 to 45 are attached to the movable body 462 in a state of being held by a nozzle arm (not illustrated). The nozzle moving mechanism 46 can allow the nozzles 41 to 45 to move between a position on an upper side of the center of the substrate W that is held by the substrate supporting unit 32, and a position on an upper side of the peripheral edge of the substrate W, and can allow the nozzles 41 to 45 to move up to a stand-by position on an outer side of the cup 35 in a plain view.

The sublimable substance solution, which is supplied from the sublimable substance solution nozzle 45, is a solution that is obtained by dissolving a sublimable substance in a solvent. The sublimable substance is a substance that sublimates at a temperature equal to or higher than a first temperature $T_1$ at an ambient pressure inside a heating processing chamber 52 of the solid material removal processing unit 5. The first temperature corresponds to a sublimation point of the sublimable substance at the ambient pressure inside the heating processing chamber 52, and is appropriately determined in accordance with the kind of the sublimable substance. A sublimable substance of which sublimation point is the first temperature $T_1$ sublimates when being heated at a temperature equal to or higher than the first temperature $T_1$. For example, the first temperature $T_1$ is a temperature of from 100° C. to 300° C. Examples of the sublimable substance, which is used in this embodiment, include ammonium fluorosilicate (($NH_4$)$_2SiF_6$), camphor, naphthalene, and the like. In the case of using ammonium fluorosilicate (($NH_4$)$_2SiF_6$) as the sublimable substance, for example, pure water (DIW), a mixed solution of DIW and isopropyl alcohol (IPA), and the like can be used as the solvent. In the case of using the camphor or naphthalene as the sublimable substance, for example, alcohols (for example, IPA), and the like can be used as the solvent. The sublimable substance is not limited to the above-described example, and may be an arbitrary substance as long as a solid state is maintained before initiation of heating processing. Accordingly, the first temperature $T_1$ may be set to a temperature equal to or higher than room temperature (for example, 20° C.) of the heating processing chamber 52 before initiation of heating.

The sublimable substance solution, which is supplied from the sublimable substance solution nozzle 45, contains an impurity in addition to the sublimable substance and the solvent. Examples of the impurity includes a substance that is mixed-in to the sublimable substance during manufacturing of the sublimable substance, a substance that is mixed-in to the solvent during manufacturing of the solvent, and the like. The present applicant has specified that specific examples of the impurity include an organic impurity (for example, hexamethylcyclotrisiloxane, methylamine, 1-bromooctadecane), a polymer having a fluorine atom (for example, polyvinylidene fluoride), and the like. The sublimable substance and/or the solvent, which are used as raw materials of the sublimable substance solution, contain an impurity, and thus the sublimable substance solution contains an impurity in addition to the sublimable substance and the solvent. The impurity includes a substance that evaporates at a temperature equal to or higher than a second temperature $T_2$ that is higher than the first temperature $T_1$ at an ambient pressure inside the heating processing chamber 52 of the solid material removal processing unit 5. An impurity, which evaporates at a temperature equal to or higher than the second temperature $T_2$, is either a substance that evaporates at a temperature equal to higher than the second temperature $T_2$ without being thermally decomposed during heating at a temperature equal to or higher than the second temperature $T_2$, or a substance which is thermally decomposed during heating at a temperature equal to or higher than the second temperature $T_2$, and generates a decomposition product that evaporates at a temperature equal to or higher than the second temperature $T_2$ due to the thermal decomposition. The second temperature $T_2$ corresponds to the boiling point of an impurity or a decomposition product thereof at an ambient pressure inside the heating processing chamber 52, and is appropriately determined in accordance with the kind of the impurity. An impurity or decomposition product thereof of which boiling point is the second temperature $T_2$ evaporates when being heated at a temperature equal to or higher than the second temperature $T_2$. For example, the second temperature $T_2$ is a temperature that is higher than 300° C. and equal to or lower than 500° C.

The second temperature $T_2$ is a temperature higher than the first temperature $T_1$. The first temperature $T_1$ and the second temperature $T_2$ are affected by the ambient pressure. Accordingly, the first temperature $T_1$ and the second temperature $T_2$ are compared with each other at the same ambient pressure, that is, at the ambient pressure inside the heating processing chamber 52 of the solid material removal processing unit 5 to determine which of the first temperature $T_1$ and the second temperature $T_2$ is higher. For example, the ambient pressure inside the heating processing chamber 52 is 0.01 Pa to 101325 Pa, and preferably 0.1 Pa to 10 Pa. When the melting point and the boiling point of the sublimable substance under the ambient pressure inside the heating processing chamber 52 are respectively set as $T_m$ and $T_b$, typically, a relationship of $T_1<T_m<T_b<T_2$ is established.

Figure 3:
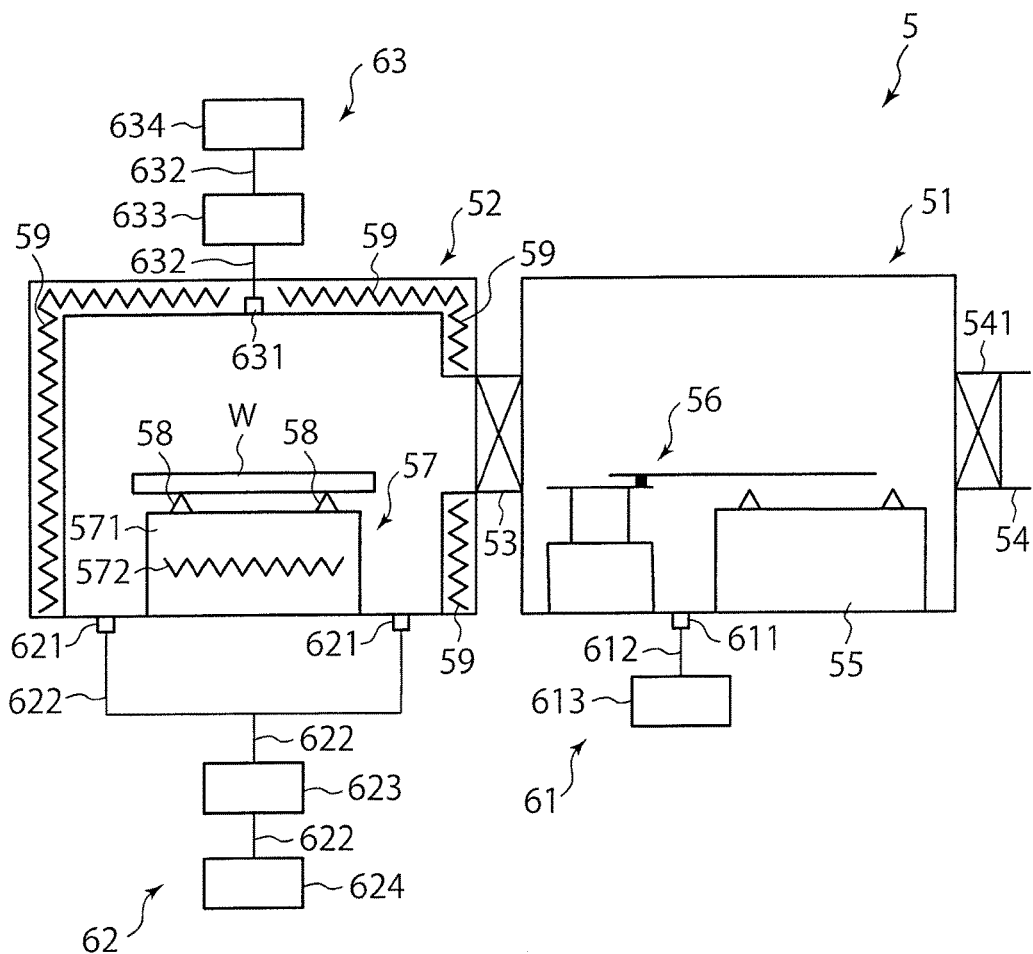
FIG. 3 is a schematic diagram illustrating a structure of a solid material removal processing unit that is provided to the substrate processing apparatus illustrated in FIG. 1.

As illustrated in FIG. 3, the solid material removal processing unit 5 includes a load lock chamber 51, and the heating processing chamber 52 that is connected to the load lock chamber 51 through an air-tight shutter 53 such as a gate valve.

As illustrated in FIG. 3, the load lock chamber 51 is provided with an atmosphere side carrying-in/out port 54 having an air-tight shutter 541 at a position that is opposite to the air-tight shutter 53. As illustrated in FIG. 3, at least one substrate loading stage 55 and a vacuum conveying arm 56 are provided in the load lock chamber 51. An atmosphere conveying arm (that is, an arm of the substrate transfer device 131, which participates to conveyance of the substrate W between the liquid processing unit 3 and the solid material removal processing unit 5) that conveys the substrate W in a conveying space in the air atmosphere on an outer side of the load lock chamber 51, and the vacuum conveying arm 56 can access the substrate loading stage 55.

As illustrated in FIG. 3, an exhaust unit 61 that exhausts the atmosphere inside the load lock chamber 51 is provided at the bottom of the load lock chamber 51. As illustrated in FIG. 3, the exhaust unit 61 includes one or a plurality of exhaust ports 611 which are provided at the bottom of the load lock chamber 51, a vacuum pump 613 that is connected to the exhaust port 611 through an exhaust duct (exhaust line) 612. When the atmosphere inside the load lock chamber 51 is discharged from the load lock chamber 51 through the exhaust port 611 and the exhaust duct 612 which are suctioned by the vacuum pump 613, the pressure inside the load lock chamber 51 can be reduced so that the ambient pressure inside the load lock chamber 51 becomes approximately the same as the ambient pressure inside the heating processing chamber 52.

As illustrated in FIG. 3, a substrate heating unit 57 is provided in the heating processing chamber 52. The substrate heating unit 57 includes a metallic block 571 and a heater 572 such as a resistive heating unit and a lamp heater (for example, an LED lamp heater) which are embedded in the metallic block 571. For example, the substrate heating unit 57 is a heat plate. A plurality of substrate holding members 58 protrude from an upper surface of the metallic block 571. The substrate holding members 58 support a peripheral edge portion of a lower surface of the substrate W, and thus a small gap is formed between the lower surface of the substrate W and the upper surface of the metallic block 571. The vacuum conveying arm 56, which are provided in the load lock chamber 51, can also access the substrate heating unit 57.

The substrate heating unit 57 can heat the substrate W that is held on the substrate heating unit 57 by the substrate holding members 58 from an initial temperature to a temperature equal to or higher than the second temperature $T_2$. The initial temperature of the substrate W is a temperature before heating, and is, for example, a temperature that is lower than the first temperature $T_1$. The metallic block 571 has heat resistance against a temperature equal to or higher than the second temperature $T_2$. The heater 572 can perform heating at a temperature and time which are set in advance. Accordingly, the substrate heating unit 57 can heat the substrate W while gradually changing a heating temperature or while keeping a heating temperature constant. For example, the substrate heating unit 57 can heat the substrate W at a temperature equal to or higher than the first temperature $T_1$ and lower than the second temperature $T_2$ (for example, a temperature that is equal to or higher than the first temperature $T_1$ and lower than the melting point $T_m$ of the sublimable substance, a temperature that is equal to or higher than the melting point $T_m$ of the sublimable substance and lower than the boiling point $T_b$ of the sublimable substance, a temperature that is equal to or higher than the boiling point $T_b$ of the sublimable substance and lower than the second temperature $T_2$, and the like) for predetermined time (for example, time sufficient for occurrence of sublimation of the sublimable substance), and then can heat the substrate W at a temperature equal to or higher than the second temperature $T_2$ for predetermined time (for example, time sufficient for occurrence of evaporation of an impurity). In addition, the substrate heating unit 57 can heat the substrate W at a temperature equal to or higher than the second temperature $T_2$ for predetermined time (time sufficient for occurrence of sublimation of the sublimable substance and evaporation of an impurity) from the beginning.

As illustrated in FIG. 3, a wall-surface heating unit 59, which includes a heater such as a resistive heating unit and a lamp heater (for example, an LED lamp heater), is provided at a wall portion of the heating processing chamber 52. For example, the wall-surface heating unit 59 is a heat plate. The wall-surface heating unit 59 can be provided at a ceiling wall portion, a bottom wall portion, and the like of the heating processing chamber 52 in addition to a side wall portion of the heating processing chamber 52. The wall-surface heating unit 59 can heat the wall surface of the heating processing chamber 52 up to a temperature equal to or higher than the second temperature $T_2$. The wall portion of the heating processing chamber 52 has heat resistance against a temperature equal to or higher than the second temperature $T_2$. The wall-surface heating unit 59 can heat the wall surface of the heating processing chamber 52 while gradually changing a heating temperature or while keeping a heating temperature constant.

As illustrated in FIG. 3, an exhaust unit 62 that exhausts the atmosphere inside the heating processing chamber 52 is provided at the bottom of the heating processing chamber 52. As illustrated in FIG. 3, the exhaust unit 62 includes one or a plurality of exhaust ports 621 which are provided at the bottom of the heating processing chamber 52, a cold trap 623 that is connected to the exhaust port 621 through an exhaust duct (exhaust line) 622, and a vacuum pump 624 that is connected to the cold trap 623 through the exhaust duct (exhaust line) 622. When the atmosphere inside the heating processing chamber 52 is discharged from the heating processing chamber 52 through the exhaust port 621 and the exhaust duct 622 which are suctioned by the vacuum pump 624, the pressure inside the heating processing chamber 52 can be reduced.

As illustrated in FIG. 3, an exhaust unit 63 that exhausts the atmosphere inside the heating processing chamber 52 is provided on an upper side of the heating processing chamber 52. As illustrated in FIG. 3, the exhaust unit 63 includes one or a plurality of exhaust ports 631 which are provided on an upper side of the heating processing chamber 52, a cold trap 633 that is connected to the exhaust port 631 through an exhaust duct (exhaust line) 632, and a vacuum pump 634 that is connected to the cold trap 633 through the exhaust duct (exhaust line) 632. When the atmosphere inside the heating processing chamber 52 is discharged from the heating processing chamber 52 through the exhaust port 631 and the exhaust duct 632 which are suctioned by the vacuum pump 634, the pressure inside the heating processing chamber 52 can be reduced.

The control device 7 is, for example, a computer including a CPU, an MPU, a RAM, a ROM, and the like, and includes a control unit 71 such as the CPU and the MPU, and a storage unit 72 such as the RAM and the ROM. A program, which controls various kinds of processing performed by the substrate processing apparatus 1, is stored in the storage unit 72. The control unit 71 reads and executes a program that is stored in the storage unit 72, and controls a series of operations of the substrate processing apparatus 1. The program may be recorded on a computer-readable recording medium, or may be installed in the storage unit 72 of the control device 7 from the recording medium. Examples of the computer-readable recording medium include a hard disk (HD), a flexible disk (FD), a compact disk (CD), a magneto-optical disc (MO), a memory card, and the like. For example, a program, which allows the computer to control the substrate processing apparatus 1 so as to execute the following substrate processing method during execution by the computer so as to control a series of operations of the substrate processing apparatus 1, is recorded on the recording medium.

Next, description will be given of a substrate drying method that is performed by the substrate processing apparatus 1. The substrate drying method, which is performed by the substrate processing apparatus 1, includes liquid processing (a chemical liquid cleaning step, a rinsing step, a solvent substitution step, a sublimable substance solution filling step, and a solid material precipitation step) with respect to the substrate W, and solid material removal processing with respect to the substrate W after being subjected to the liquid processing. The liquid processing is performed by the liquid processing unit 3 of the substrate processing apparatus 1, and the solid material removal processing is performed by the solid material removal processing unit 5 of the substrate processing apparatus 1. An operation of the liquid processing unit 3 in the liquid processing and an operation of the solid material removal processing unit 5 in the solid material removal processing are controlled by the control device 7.

First, the substrate W (refer to FIG. 4A) subjected to dry etching so as to form a pattern in a semiconductor device forming film, for example, an SiN film on a surface of the substrate is carried-in to the liquid processing unit 3 by the substrate transfer device 131, and is rotated at a predetermined speed while being horizontally held by the spin chuck 31.

Next, the chemical liquid nozzle 41 is allowed to be located on an upper side of the center of the substrate W while rotating the substrate W at the predetermined speed, and a chemical liquid is supplied to the substrate W by the chemical liquid nozzle 41. According to this, contaminants such as etching residues, particles, and the like are removed from a surface of the substrate W (chemical liquid cleaning step). Examples of the chemical liquid, which is used in the chemical liquid cleaning step, include DHF, BHF, SC-1, SC-2, APM, HPM, SPM, and the like.

Next, the rinse liquid nozzle 42 is allowed to be located on an upper side of the center of the substrate W while rotating the substrate W at the predetermined speed, and a rinse liquid such as DIW is supplied to the substrate W by the rinse liquid nozzle 42. According to this, a chemical liquid, and contaminants such as etching residues, particles, and the like, which remain even after the chemical liquid cleaning step, are removed from the surface of the substrate W (rinsing step).

Next, the solvent nozzle 43 is allowed to be located on an upper side of the center of the substrate W while rotating the substrate W at the predetermined speed, and a solvent such as IPA is supplied to the substrate W by the solvent nozzle 43. According to this, the rinse liquid such as DIW on the substrate W is substituted with the solvent such as IPA (solvent substitution step). The solvent substitution process may be omitted.

Figure 4B:
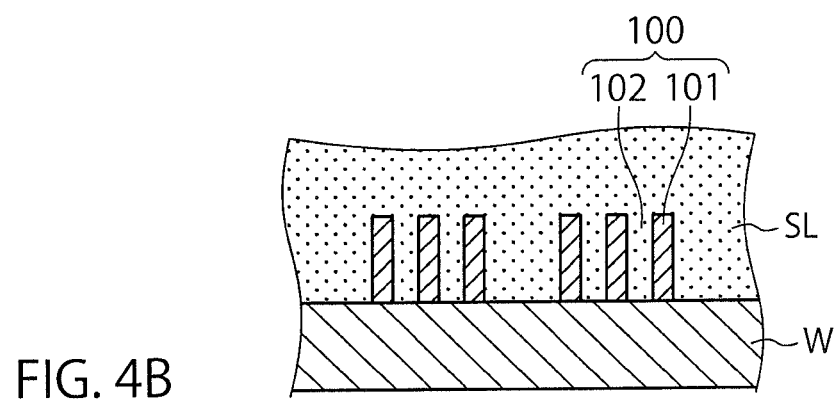

Next, the sublimable substance solution nozzle 45 is allowed to be located on an upper side of the center of the substrate W while rotating the substrate W at the predetermined speed, and the sublimable substance solution is supplied to the substrate W by the sublimable substance solution nozzle 45. According to this, the solvent such as IPA on the substrate W is substituted with the sublimable substance solution (sublimable substance solution filling step). In the sublimable substance solution filling step, as illustrated in FIG. 4B, the entirety of the surface of the substrate W is covered with a liquid film of the sublimable substance solution SL, and the concave portion 102 of the concavo-convex pattern 100 formed on the surface of the substrate W is filled with the sublimable substance solution SL. In the sublimable substance solution filling step, the thickness of the liquid film of the sublimable substance solution SL, and the thickness of a film of the solid material SS that is obtained after drying can be controlled by controlling the number of revolutions of the substrate W.

Figure 4C:
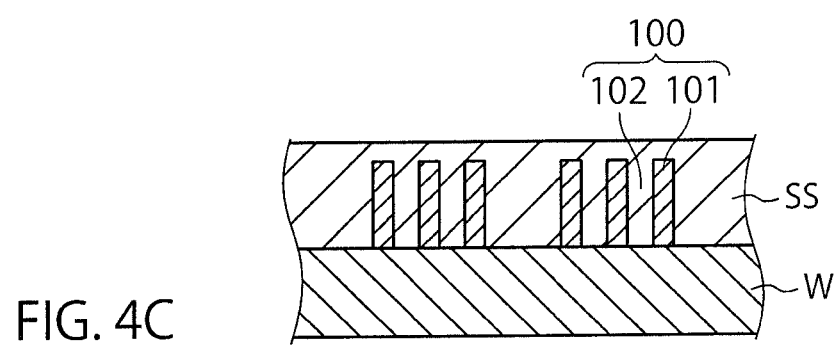

Next, the solvent in the sublimable substance solution is evaporated to allow a solid material to precipitate (solid material precipitation step). As illustrated in FIG. 4C, the solid material SS, with which the concave portion 102 of the concavo-convex pattern 100 of the substrate W is filled, is formed by evaporating the solvent in the sublimable substance solution supplied to the concave portion 102. The solid material SS has a film shape (thin layer shape), and contains a solid-state sublimable substance that sublimates at a temperature equal to or higher than the first temperature $T_1$, and an impurity that evaporates at a temperature equal to or higher than the second temperature $T_2$ that is higher than the first temperature $T_1$. The solid material precipitation step may be performed through natural drying, and drying may be promoted by rotating the substrate W or by spraying a drying gas from the dry gas nozzle 44 to the substrate W. In this manner, a solid material filled substrate (refer to FIG. 4C), which includes the substrate W and the solid material SS with which the concave portion 102 of the concavo-convex pattern 100 of the substrate W is filled, is formed. In addition, as described later, when the solid material filled substrate is subjected to the solid material removal processing by the solid material removal processing unit 5, the solid material SS, with which the concave portion 102 of the concavo-convex pattern 100 is filled, is removed from the substrate W.

When the solid material precipitation step is completed, the substrate W is carried-out from the liquid processing unit 3 by the substrate transfer device 131, and is carried-in to the solid material removal processing unit 5. When carrying-in the substrate W to the solid material removal processing unit 5, the air-tight shutter 53 on the heating processing chamber 52 side is closed, and the air-tight shutter 541 of the atmosphere side carrying-in/out port 54 is opened in a state in which the inside of the load lock chamber 51 is set to the atmospheric pressure by a ventilation mechanism (not illustrated). In this state, the substrate transfer device 131 enters the inside of the load lock chamber 51 to dispose the substrate W on the substrate loading stage 55. Then, the air-tight shutter 541 is closed, and the vacuum pump 613 of the exhaust unit 61 operates. According to this, an ambient pressure inside the load lock chamber 51 is reduced to be approximately the same as the ambient pressure inside the heating processing chamber 52.

Next, the air-tight shutter 53 is opened. The vacuum conveying arm 56 takes out the substrate W from the substrate loading stage 55, and disposes the substrate W in the heating processing chamber 52. The substrate W is disposed on the substrate heating unit 57 in a state of being held by the holding members 58. The vacuum conveying arm 56 is retracted from the heating processing chamber 52 after disposing the substrate W. Then, the air-tight shutter 53 is closed. The ambient pressure inside the heating processing chamber 52 is maintained at a reduced pressure state of, for example, 0.01 Pa to 101325 Pa, and preferably 0.1 Pa to 10 Pa.

Figure 4D:
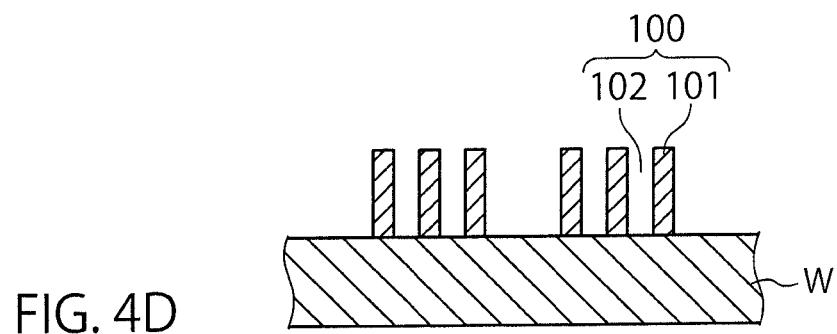

Next, the substrate W disposed in the heating processing chamber 52 is heated to a temperature equal to or higher than the second temperature $T_2$ by the substrate heating unit 57 while discharging the atmosphere inside the heating processing chamber 52 by one or both of the exhaust unit 62 and the exhaust unit 63. For example, the temperature equal to or higher than the second temperature $T_2$ is a temperature that is higher than 300° C. and equal to or lower than 500° C. The temperature equal to or higher than the second temperature $T_2$ may be a temperature that is higher than 500° C. In this case, the upper limit of the temperature is, for example, 1000° C. When heating the substrate W disposed in the heating processing chamber 52 to the temperature equal to or higher than the second temperature $T_2$ by the substrate heating unit 57, the final temperature of the substrate W may be a temperature equal to or higher than the second temperature $T_2$. Accordingly, the substrate heating unit 57 may heat the substrate W while gradually changing a heating temperature or while keeping a heating temperature constant. Heating time in the substrate heating unit 57 is appropriately adjusted to time sufficient for occurrence of sublimation of the sublimable substance and evaporation of an impurity. When the substrate W disposed in the heating processing chamber 52 is heated by the substrate heating unit 57 to a temperature equal to or higher than the second temperature $T_2$, as illustrated in FIG. 4D, the sublimable substance sublimates and is removed from the substrate W, and the impurity evaporates and is removed from the substrate W (solid material removal step). In the solid material removal step, since the final temperature of the substrate W is a temperature equal to or higher than the second temperature $T_2$, the sublimable substance and the impurity, which have been already removed from the substrate W, are prevented from being reattached to the substrate W.

A gas-state sublimable substance that has already sublimated and a gas-state impurity that has already evaporated, which exist in the atmosphere inside the heating processing chamber 52, are discharged from the heating processing chamber 52 by one or both of the exhaust unit 62 and the exhaust unit 63. The gas-state sublimable substance that has already sublimated and the gas-state impurity that has already evaporated are likely to flow to an upper side in the atmosphere inside the heating processing chamber 52. Accordingly, the exhaust unit 63, which is provided on an upper side of the heating processing chamber 52, can effectively discharge the gas-state sublimable substance that has already sublimated and the gas-state impurity that has already evaporated, which exist in the atmosphere inside the heating processing chamber 52, from the heating processing chamber 52. The effective discharging is advantageous from the viewpoint of preventing the sublimable substance and the impurity, which have been already removed from the substrate W, from being reattached to the substrate W. A gas, which is discharged from the heating processing chamber 52, is cooled down when passing through the cold trap 623 and/or the cold trap 633, and the sublimable substance and the impurity, which are contained in the gas, precipitate in the cold trap, for example, to an inner wall surface of the cold trap 623 and/or the cold trap 633. Therefore, the concentration of the sublimable substance and the impurity, which are contained in the gas that flows into the vacuum pump 624 and/or the vacuum pump 634, is very low.

In an embodiment (hereinafter, referred to as "first embodiment") of the solid material removal step, the substrate W disposed in the heating processing chamber 52 is heated by the substrate heating unit 57 at a temperature equal to or higher than the first temperature $T_1$ and lower than the second temperature $T_2$ (for example, a temperature that is equal to or higher than the first temperature $T_1$ and lower than the melting point $T_m$ of the sublimable substance, a temperature that is equal to or higher than the melting point $T_m$ of the sublimable substance and lower than the boiling point $T_b$ of the sublimable substance, a temperature that is equal to or higher than the boiling point $T_b$ of the sublimable substance and lower than the second temperature $T_2$, and the like) while discharging the atmosphere inside the heating processing chamber 52 by one or both of the exhaust unit 62 and the exhaust unit 63. Subsequently, the substrate W is heated at a temperature equal to or higher than the second temperature $T_2$. When the substrate W is heated at a temperature equal to or higher than the first temperature $T_1$ and is lower than the second temperature $T_2$, the sublimable substance sublimates and is removed from the substrate W, and when the substrate W is heated at a temperature equal to or higher than the second temperature $T_2$, the impurity evaporates and is removed from the substrate W. In addition, since the final temperature of the substrate W is a temperature equal to or higher than the second temperature $T_2$, the sublimable substance and the impurity, which have been already removed from the substrate W, are prevented from being reattached to the substrate W. When heating the substrate W at a temperature equal to or higher than the first temperature $T_1$ and lower than the second temperature $T_2$, a heating temperature of the substrate heating unit 57 is set to a temperature that is equal to or higher than the first temperature $T_1$ and lower than the second temperature $T_2$. When heating the substrate W at a temperature equal to or higher than the second temperature $T_2$, the heating temperature of the substrate heating unit 57 is set to a temperature equal to or higher than the second temperature $T_2$. For example, the temperature, which is equal to or higher than the first temperature $T_1$ and lower than the second temperature $T_2$, is a temperature of 100° C. to 300° C. For example, the temperature, which is equal to or higher than the second temperature $T_2$, is a temperature that is higher than 300° C. and equal to or lower than 500° C. The temperature, which is higher than the second temperature $T_2$, may be a temperature higher than 500° C. In this case, for example, the upper limit of the temperature is 1000° C. Time taken to heat the substrate W at the temperature equal to or higher than the first temperature $T_1$ and lower than the second temperature $T_2$ is set to time sufficient for occurrence of sublimation of the sublimable substance, for example, 10 seconds to 30 minutes, and preferably 30 seconds to 3 minutes. Time taken to heat the substrate W at the temperature equal to or higher than the second temperature $T_2$ is set to time sufficient for occurrence of evaporation of the impurity, for example, 10 seconds to 10 minutes, and preferably 30 seconds to 3 minutes.

In the first embodiment of the solid material removal step, it is preferable to increase an exhaust volume per unit time discharged from the heating processing chamber 52 (if one of the exhaust unit 62 and the exhaust unit 63 operates, it means an exhaust volume per unit time discharged from one of them, and if both of the exhaust unit 62 and the exhaust unit 63 operate, it means a total exhaust volume per unit time discharged from both of them) when the substrate heating unit 57 heats the substrate W at a temperature equal to or higher than the second temperature $T_2$ so as to exceed an exhaust volume per unit time discharged from the heating processing chamber 52 (if one of the exhaust unit 62 and the exhaust unit 63 operates, it means an exhaust volume per unit time discharged from one of them, and if both of the exhaust unit 62 and the exhaust unit 63 operate, it means a total exhaust volume per unit time discharged from both of them) when the substrate heating unit 57 heats the substrate W at a temperature equal to or higher than the first temperature $T_1$ and lower than the second temperature $T_2$. According to this, it is possible to effectively remove the sublimable substance and the impurity from the substrate W, and it is also possible to effectively prevent the sublimable substance and the impurity, which have been already removed from the substrate W, from being reattached to the substrate W. In a case where both of the exhaust unit 62 and the exhaust unit 63 operate, an exhaust volume per unit time discharged from both of them may be increased, or an exhaust volume per unit time discharged from one of them may be increased. In addition, an exhaust volume per unit time discharged from the heating processing chamber 52 may be increased by operating one of the exhaust unit 62 and the exhaust unit 63 when the substrate heating unit 57 heats the substrate W at a temperature equal to or higher than the first temperature $T_1$ and lower than the second temperature $T_2$, and operating both of the exhaust unit 62 and the exhaust unit 63 when the substrate heating unit 57 heats the substrate W at a temperature equal to or higher than the second temperature $T_2$.

In another embodiment (hereinafter, referred to as "second embodiment") of the solid material removal step, the substrate W disposed in the heating processing chamber 52 is heated by the substrate heating unit 57 at a temperature equal to or higher than the second temperature $T_2$ from the beginning while discharging the atmosphere inside the heating processing chamber 52 by one or both of the exhaust unit 62 and the exhaust unit 63. If the substrate W is heated at a temperature equal to or higher than the second temperature $T_2$ from the beginning, the sublimable substance sublimates and is removed from the substrate W, and the impurity evaporates and is removed from the substrate W. When heating the substrate W at a temperature equal to or higher than the second temperature $T_2$, a heating temperature of the substrate heating unit 57 is set to a temperature equal to or higher than the second temperature $T_2$ from the beginning. For example, the temperature equal to or higher than the second temperature $T_2$ is a temperature that is higher than 300° C. and equal to or lower than 500° C. The temperature equal to or higher than the second temperature $T_2$ may be a temperature that is higher than 500° C. In this case, for example, the upper limit of the temperature is 1000° C. Time taken to heat the substrate W at a temperature equal to or higher than the second temperature $T_2$ is set to time sufficient for occurrence of sublimation of the sublimable substance and evaporation of the impurity, for example, 10 seconds to 10 minutes, and preferably 30 seconds to 3 minutes.

In still another embodiment (hereinafter, referred to as "third embodiment") of the solid material removal step, the temperature of the substrate W disposed in the heating processing chamber 52 is maintained at a temperature equal to or higher than the second temperature $T_2$ for predetermined time by the substrate heating unit 57 while discharging the atmosphere inside the heating processing chamber 52 by one or both of the exhaust unit 62 and the exhaust unit 63. According to this, it is possible to effectively remove the sublimable substance and the impurity from the substrate W, and it is also possible to effectively prevent the sublimable substance and the impurity, which have been already removed from the substrate W, from being reattached to the substrate W. For example, time taken to maintain the temperature of the substrate W at a temperature equal to or higher than the second temperature $T_2$ is set to 10 seconds to 10 minutes, and preferably 30 seconds to 3 minutes.

In still another embodiment (hereinafter, referred to as "fourth embodiment") of the solid material removal step, when the substrate W disposed in the heating processing chamber 52 is heated by the substrate heating unit 57 while discharging the atmosphere inside the heating processing chamber 52 by one or both of the exhaust unit 62 and the exhaust unit 63, the wall surface of the heating processing chamber 52 is heated to a temperature equal to or higher than the second temperature $T_2$ by the wall-surface heating unit 59. When the wall surface of the heating processing chamber 52 is heated to a temperature equal to or higher than the second temperature $T_2$, it is possible to prevent the gas-state sublimable substance that has already sublimated and the gas-state impurity that has already evaporated from being cooled down on the wall surface of the heating processing chamber 52 and from being reattached to the wall surface of the heating processing chamber 52. Accordingly, the gas-state sublimable substance that has already sublimated and the gas-state impurity that has already evaporated remain in the atmosphere inside the heating processing chamber 52. As a result, it is possible to effective discharge the gas-state sublimable substance that has already sublimated and the gas-state impurity that has already evaporated from the heating processing chamber 52, and it is also possible to effectively prevent the sublimable substance and the impurity, which have been already removed from the substrate W, from being reattached to the substrate W.

In the solid material removal step, two or more embodiments of the first embodiment to the fourth embodiment can be combined with each other.

The substrate W, from which the sublimable substance and the impurity have been already removed, is conveyed-out from the solid material removal processing unit 5 in the order opposite to the above-described order.

Sublimable substances, which are represented by the following Formulae (Ia), (Ib), (Ic), (Id), (IIa), (IIb), (IIc), (IId), (IIe), (IIIc), (IIIb), (IVa), and (IVb), may be used in place of or in combination of the sublimable substance that is used in the above-described embodiments (refer to JP 2015-106645 A). These sublimable substances are organic materials which have a vapor pressure at a room temperature of 5 Pa or less, and show sublimability under pressure-reduction and/or heating conditions.

[Chemical Formulae]

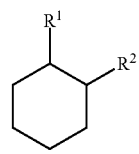

(Ia)

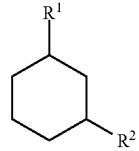

(Ib)

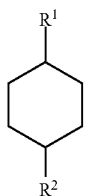
(Ic)

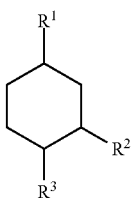
(Id)

In Formulae (Ia), (Ib), (Ic), and (Id), R¹, R², and R³ independently represent a hydroxy group (—OH), a carboxyl group (—COOH), an amino group (—NH₂), an amide group (—CONH₂), a nitro group (—NO₂), or a methyl ester group (—COO—CH₃).

[Chemical Formulae]

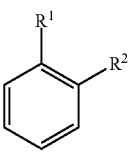
(IIa)

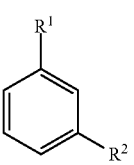
(IIb)

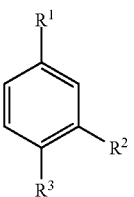
(IIc)

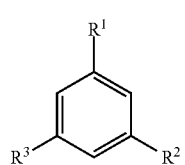
(IId)

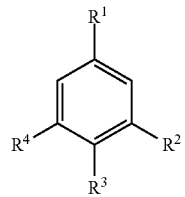
(IIe)

In Formulae (IIa), (IIb), (IIc), (IId), and (IIe), R¹, R², R³, and R⁴ independently represent a hydroxy group (—OH), a carboxyl group (—COOH), an amino group (—NH₂), an amide group (—CONH₂), a nitro group (—NO₂), a methyl ester group (—COO—CH₃), a methoxy group (—OCH₃), an ethoxy group (—OCH₂CH₃), or a propoxy group (—OCH₂CH₂CH₃).

[Chemical Formulae]

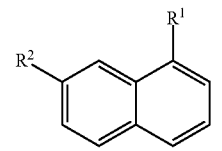
(IIIa)

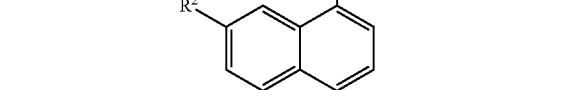
(IIIb)

In Formulae (IIIc) and (IIIb), R¹ and R² independently represent a hydroxy group (—OH), a carboxyl group (—COOH), an amino group (—NH₂), an amide group (—CONH₂), a nitro group (—NO₂), a methyl ester group (—COO—CH₃), a methoxy group (—OCH₃), an ethoxy group (—OCH₂CH₃), or a propoxy group (—OCH₂CH₂CH₃).

[Chemical Formulae]

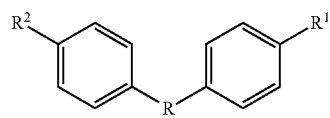
(IVa)

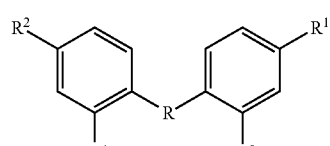
(IVb)

In Formulae (IVa) and (IVb), R¹, R², R³, and R⁴ independently represent a hydroxy group (—OH), a carboxyl group (—COOH), an amino group (—NH₂), an amide group (—CONH₂), a nitro group (—NO₂), a methyl ester group (—COO—CH₃), a methoxy group (—OCH₃), an ethoxy group (—OCH₂CH₃), or a propoxy group (—OCH₂CH₂CH₃), and R represents a carbonyl group (—CO—), a peptide bond (—CONH—), an ester bond (—COO—), an ether bond (—O—), a (—NHNHO—) bond, a (—COCOO—) bond, or a (—CHCH—) bond.

Examples of the sublimable substances represented by Formulae (Ia) to (Id) include cyclohexane-1,2-dicarboxylic acid, cyclohexane-1,3-dicarboxylic acid, cyclohexane-1,4-dicarboxylic acid, cyclohexane-1,2,4-tricarboxylic acid, and the like.

Examples of the sublimable substance represented by Formula (IIa) or (IIb) include phthalic acid, aminoacetophenone, and the like.

Examples of the sublimable substance represented by Formula (IIc) include vanillin, 4-hydroxy phthalic acid, trimellitic acid, trimellitic anhydride, dimethoxy acetophenone, and the like.

Examples of the sublimable substance represented by Formula (IId) include 5-hydroxy-iso-phthalic acid, and the like.

Examples of the sublimable substance represented by Formula (IIe) include gallic acid, methyl gallate, and the like.

Examples of the sublimable substance represented by Formula (IIIc) or (IIIb) include 1,7-dihydronaphthalene, and the like.

Examples of the sublimable substance represented by Formula (IVa) or (IVb) include 4,4'-dihydroxybenzophenone, 2,2',4,4'-tetrahydroxybenzophenone, and the like.

EXPLANATION OF REFERENCES

1 Substrate processing apparatus
3 Liquid processing unit
5 Solid material removal processing unit
52 heating processing chamber
57 Substrate heating unit
59 Wall-surface heating unit
62, 63 Exhaust unit
7 Control device
W Substrate
100 Concavo-convex pattern
102 Concave portion

The invention claimed is:

1. A substrate processing apparatus, comprising:
a processing unit configured to remove from a substrate having a concavo-convex pattern formed on a surface of the substrate, a solid material with which a concave portion of the concavo-convex pattern is filled; and
a control unit configured to control an operation of the processing unit,
wherein the processing unit comprises a processing chamber in which the substrate is disposed, a substrate heating unit configured to heat the substrate disposed in the processing chamber, wherein the processing unit further comprises a wall-surface heating unit configured to heat a wall surface of the processing chamber, and an exhaust unit configured to discharge an atmosphere inside the processing chamber,
the solid material is formed by evaporating a solvent in a sublimable substance solution supplied to the concave portion, the sublimable substance solution containing a sublimable substance that sublimates at a temperature equal to or higher than a first temperature, and an impurity that evaporates at a temperature equal to or higher than a second temperature that is higher than the first temperature, and
the control unit controls the substrate heating unit and the exhaust unit so that the substrate disposed in the processing chamber is heated to a temperature equal to or higher than the second temperature while discharging the atmosphere inside the processing chamber.

2. The substrate processing apparatus according to claim 1,
wherein the control unit controls the substrate heating unit and the exhaust unit so that the substrate disposed in the processing chamber is heated at a temperature that is equal to or higher than the first temperature and lower than the second temperature and is subsequently heated at a temperature equal to or higher than the second temperature while discharging the atmosphere inside the processing chamber.

3. The substrate processing apparatus according to claim 2,
wherein the control unit controls the substrate heating unit and the exhaust unit so that an exhaust volume per unit time discharged from the processing chamber when the substrate disposed in the processing chamber is heated at a temperature equal to or higher than the second temperature exceeds an exhaust volume per unit time discharged from the processing chamber when the substrate disposed in the processing chamber is heated at a temperature that is equal to or higher than the first temperature and lower than the second temperature.

4. The substrate processing apparatus according to claim 1,
wherein the control unit controls the substrate heating unit and the exhaust unit so that the substrate disposed in the processing chamber is heated at the temperature equal to or higher than the second temperature while discharging the atmosphere inside the processing chamber.

5. The substrate processing apparatus according to claim 1,
wherein the control unit controls the substrate heating unit and the exhaust unit so that a temperature of the substrate disposed in the processing chamber is maintained at a temperature equal to or higher than the second temperature for predetermined time while discharging the atmosphere inside the processing chamber.

6. The substrate processing apparatus according to claim 1,
the control unit controls the substrate heating unit, the exhaust unit and the wall-surface heating unit so that the wall surface of the processing chamber is heated to a temperature equal to or higher than the second temperature when the substrate disposed in the processing chamber is heated while discharging the atmosphere inside the processing chamber.

7. The substrate processing apparatus according to claim 1,
the apparatus further comprising a supplying unit configured to supply the sublimable substance solution to the concave portion,
wherein the solid material is formed by evaporating the solvent in the sublimable substance solution supplied to the concave portion by the supplying unit.

* * * * *